United States Patent
Seidel et al.

(10) Patent No.: US 6,753,541 B1
(45) Date of Patent: Jun. 22, 2004

(54) METHOD AND APPARATUS FOR MAKING AND USING A BEACON FIDUCIAL FOR AN INTEGRATED CIRCUIT

(75) Inventors: Steve Seidel, Fremont, CA (US); Simon Tam, Redwood City, CA (US); Valluri Rao, Saratoga, CA (US); Stefan Rusu, Sunnyvale, CA (US); Richard Livengood, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/451,471

(22) Filed: Nov. 30, 1999

(51) Int. Cl.[7] .............................................. G01N 21/86
(52) U.S. Cl. ................... 250/559.44; 324/501
(58) Field of Search ................... 250/559.44, 214 R, 250/559.2, 559.3, 559.31, 559.39, 559.38, 548; 324/50, 501, 752, 753; 714/726; 382/145; 356/247, 248, 251–255; 348/87

(56) References Cited

U.S. PATENT DOCUMENTS 5,497,033 A * 3/1996 Fillion et al. ............... 257/700
5,940,545 A * 8/1999 Kash et al. ................. 382/312
5,963,781 A    10/1999 Winer
6,185,706 B1 * 2/2001 Sugasawara ................ 714/724

OTHER PUBLICATIONS

US 6,304,668, 10/2001, Evans et al. (withdrawn)*

* cited by examiner

Primary Examiner—Thanh X. Luu
(74) Attorney, Agent, or Firm—Blakely, Sokoloff, Taylor & Zafman LLP (57) ABSTRACT

In one embodiment, the present invention includes a method. In the method, a fiducial transistor is provided in an integrated circuit. Also in the method, a power conductor is coupled to a first terminal of the transistor. Also in the method, a ground conductor is coupled to a second terminal of the transistor. Also in the method, a control conductor is coupled to a third terminal of the transistor. Also in the method, other circuitry is provided, the other circuitry is operatively decoupled from the fiducial transistor and the other circuitry is operable without the fiducial transistor.

20 Claims, 9 Drawing Sheets

METHOD AND APPARATUS FOR MAKING AND USING A BEACON FIDUCIAL FOR AN INTEGRATED CIRCUIT

BACKGROUND OF THE INVENTION

1. Field of the Invention

The invention is generally related to integrated circuits and more specifically to integrated circuit processing, design, and debugging.

2. Description of the Related Art

Prior art fiducials have typically been produced with a single layer or multiple layers of metals deposited on a semiconductor substrate in a characteristic shape, such as a cross or plus-sign ('+') shape, or some similar but recognizable shape. By using a recognizable shape, these fiducials have been constrained to be large patterns which prove distinctive when viewed by the people who use them for navigating on a semiconductor integrated circuit. A fiducial in the prior art would often consume a square-shaped space on the integrated circuit 150 μm on a side, which could only be used for the fiducial, not for any active circuitry. As a result, valuable resources on the integrated circuit would be unavailable in that region.

Figure 1:
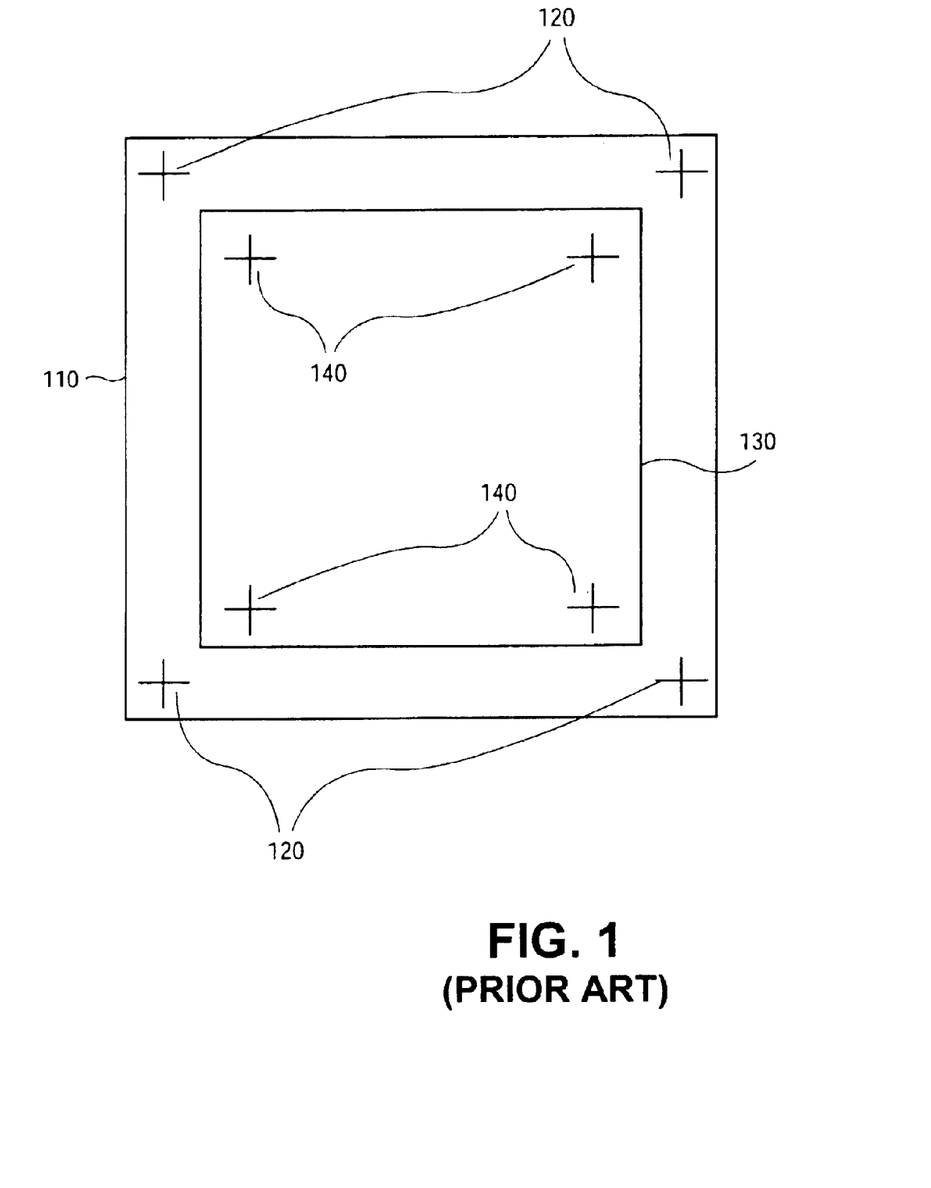
FIG. 1 illustrates a prior art block diagram of fiducials on a packaged integrated circuit.

FIG. 1 illustrates one prior art scheme for placement of fiducials. Package 110 contains integrated circuit 130. Package 110 also has four package fiducials 120 located on the outside of package 110, which are used by someone who needs to locate a specific portion of integrated circuit 130. After locating and aligning to a first package fiducial 120, a portion of the package 110 may be removed to expose integrated circuit 130. Each of four fiducials 140 are incorporated into integrated circuit 130. Upon aligning to a first fiducial 140, a person may then navigate over the integrated circuit 130 by looking at a layout diagram of integrated circuit 130 which shows the location of the fiducials 140 relative to the circuitry incorporated in integrated circuit 130.

As will be appreciated, positioning the fiducials such as fiducials 140 proves difficult due to constraints on available space on integrated circuit 130. In the case of a fiducial consuming a square of space 150 μm on a side, four such squares must be reserved in the area available on integrated circuit 130, and no other signals may be routed in those reserved areas.

Furthermore, even in situations in which automated alignment equipment is used, such equipment must use an optical system (a system for resolving optical details of an image, typically using reflected light) for locating the fiducials. Whether human, mechanical, or some combination of human and mechanical, the optical systems are limited by their inability to resolve images below a certain size (length or area) threshold on semiconductor devices due to the wavelength of light used. This limitation is particularly constraining in infrared systems which often cannot resolve features smaller than 1–2 μms, and therefore cannot reliably navigate to less than 1–2 μms from a desired location on the semiconductor. This limitation leads to a limitation on the size of fiducials used for alignment when using optical alignment systems, thus leading to the 150 μm length of prior art fiducials. It will be appreciated that even though an optical system may be capable of resolving features much smaller than the overall size of a fiducial, that the need for a distinctive shape of the fiducial leads to a fiducial much larger than the size of the smallest feature an optical system may resolve.

SUMMARY OF THE INVENTION

In one embodiment, the present invention includes a method. In the method, a fiducial transistor is provided in an integrated circuit. Also in the method, a power conductor is coupled to a first terminal of the transistor. Also in the method, a ground conductor is coupled to a second terminal of the transistor. Also in the method, a control conductor is coupled to a third terminal of the transistor. Also in the method, other circuitry is provided, the other circuitry is operatively decoupled from the fiducial transistor and the other circuitry is operable without the fiducial transistor.

BRIEF DESCRIPTION OF THE DRAWINGS

The present invention is illustrated by way of example and not limitation in the accompanying figures.

DETAILED DESCRIPTION

A method and apparatus for making and using a beacon fiducial for an integrated circuit is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, but the various embodiments may not be construed as mutually exclusive, either.

Figure 2:
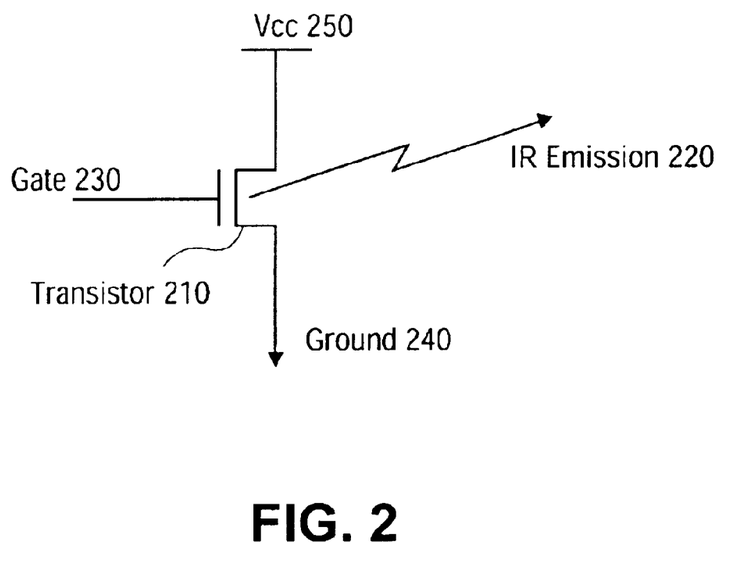
FIG. 2 illustrates an embodiment of a beacon fiducial.

Illustrated in FIG. 2 is one embodiment of a beacon fiducial suitable for use in finding portions of an integrated circuit. Transistor 210, in one embodiment, is a n-channel transistor and may be referred to as the fiducial transistor of the beacon. Vcc 250 is connected to one terminal of transistor 210 (typically referred to as the drain) and ground 240 is connected or coupled to another terminal of transistor 210 (typically referred to as the source). Gate 230 may be used to control transistor 210, and is therefore preferably connected or coupled to a control signal such as a clock or dedicated control signal, but may also be connected to Vcc 250 to produce an 'always-on' effect in transistor 210. When transistor 210 is biased to conduct across its channel, IR Emission 220 results, and the photons embodied in IR Emission 220 may be observed by some method or apparatus suitable for detecting photons. Such methods or apparatuses may be referred to collectively as photon sensors, and may include photodetectors, photo diodes, CCD (charge-coupled-device) cameras or sensors, infrared detectors or detector arrays, single element detectors, photomultiplier tubes, and other similar methods or devices.

A beacon fiducial such as the one illustrated above may be separate from the rest of the circuitry (the other circuitry) of an integrated circuit. The beacon fiducial may be completely isolated from the other circuitry, such that all of its connections are dedicated only to it (such as having dedicated bond pads and conductors connected to each terminal of the beacon fiducial transistor for example). Alternatively, the beacon fiducial may be operatively decoupled from the other circuitry, such that it may use the same signals and conductors that the other circuitry uses, but not affect the operation or performance of the other circuitry in a significant manner. In such an embodiment, the beacon fiducial may have some parasitic loading effect on the other circuitry, but would not be necessary for the function of the other circuitry. Note that isolating the beacon fiducial from the other circuitry may be viewed as an extreme example of operatively decoupling the beacon fiducial from the other circuitry. Thus, the structure illustrated in FIG. 3 may also be referred to as the fiducial transistor of a beacon fiducial. beacon fiducial may share a power (Vcc), ground, or control signal (or some combination of signals) and associated conductors, while being operatively decoupled from the other circuitry. The other circuitry would then be any circuitry or portion of the circuitry designed to perform the functions of the integrated circuit.

Figure 3:
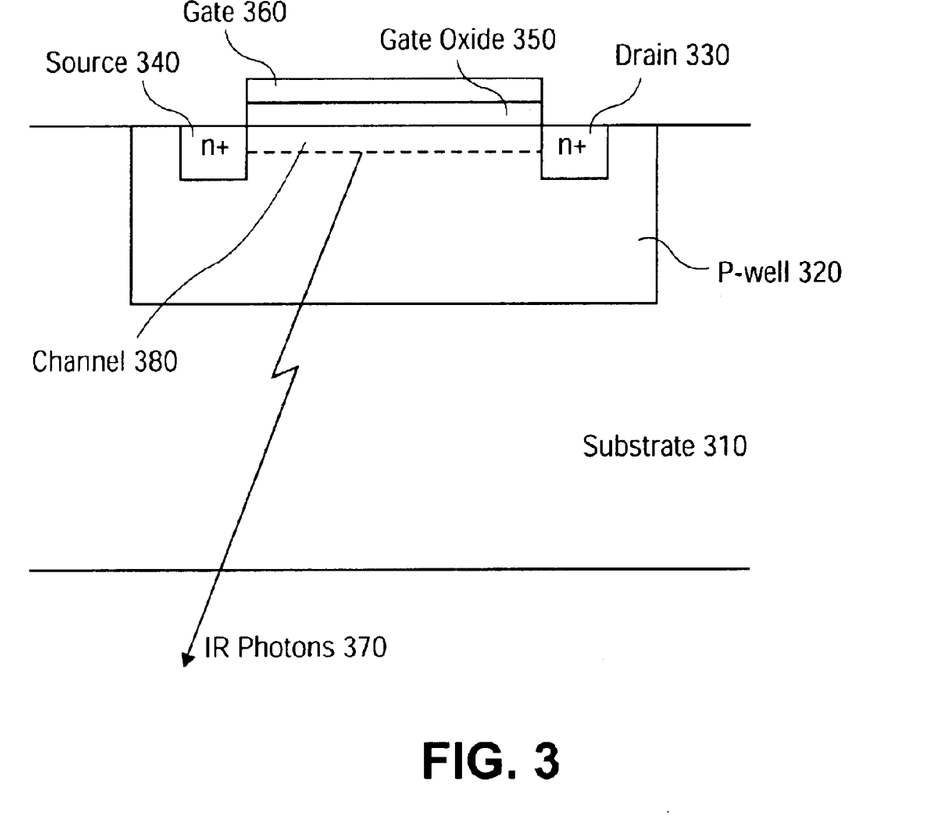
FIG. 3 illustrates an embodiment of a beacon fiducial as a cross-section of an integrated circuit.
Figure 4:
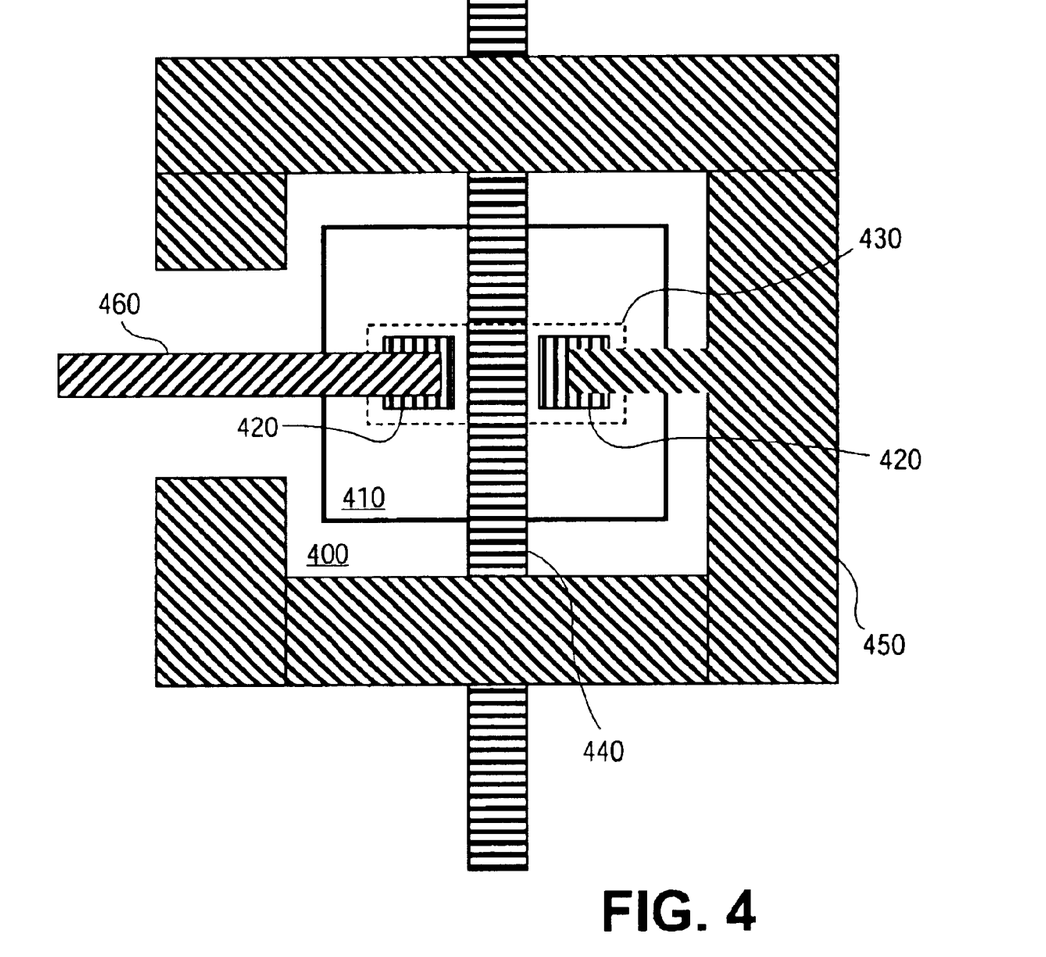
FIG. 4 illustrates a side view of a beacon fiducial in a packaged integrated circuit.

Turning to FIG. 3, an embodiment of a beacon fiducial is illustrated. Substrate 310 is a silicon substrate, and P-well 320 is an area doped with a p-type dopant. Source 340 and Drain 330 are areas doped with a high concentration of an n-type dopant. Gate 360 is a conductor formed on top of gate oxide 350, which, in one embodiment, Is formed of $SiO_2$. When the voltage between the gate 360 and the source 340 is sufficiently high, channel 380 is effectively inverted, producing a conducting path between source 340 and drain 330. When the voltage between the drain 330 and the source 340 is sufficiently high, the conducting path produced in channel 380 is used to conduct electricity between source 340 and drain 330. When electricity conducts between source 340 and drain 330, IR photons 370 are produced. In one embodiment, IR photons 370 are photons in the infrared portion of the electromagnetic spectrum, but in general a conducting N-channel transistor (which is used in one embodiment) emits photons in both the near infrared and visible portions of the electromagnetic spectrum. (The near infrared portion of the spectrum refers to that portion of the infrared spectrum having wavelengths approaching the wavelengths of visible light.) Since semiconductors such as silicon are relatively transparent to infrared photons, IR photons 370 may escape substrate 310 and be detected outside of substrate 310, such as in a photon sensor. The transistor In FIG. 4, an alternative embodiment of a beacon fiducial is illustrated. Substrate 400 is a semiconductor substrate of an integrated circuit. Well 410 is a well implanted in the substrate 400, such as a P-well doped with a p-type impurity. Implants 420 are areas within the well 410 which are doped with a heavy concentration of a different impurity from that used to dope well 410, in one embodiment resulting in the area having a n+ characteristic due to heavy doping with an n-type impurity. Conductor 440 is a gate electrode passing over the portion of well 410 disposed between the two implant 420 areas, in one embodiment having an oxide disposed between conductor 440 and well 410 (not shown). Transistor 430 is the general area where a transistor is formed by the presence of well 410, implant areas 420 and conductor 440, and may be referred to as a fiducial transistor. Implant areas 420 and conductor 440 may be thought of as first, second, and third terminals of transistor 430 respectively. Guard Ring 450 is a conductor surrounding most of well 410, and coupled to one of implant areas 420 (coupled to a first terminal for example), through a contact in one embodiment. In one embodiment, Guard ring 450 is coupled to a conductor designed for coupling to a power supply voltage of an integrated circuit. Conductor 460 is coupled to the other implant area 420 (coupled to a second terminal for example) in one embodiment. In one embodiment, conductor 460 is coupled to a conductor designed for coupling to a ground voltage of an integrated circuit. It will be appreciated that conductor 440 may, in alternative embodiments, be coupled to a conductor internal to the integrated circuit, such as a clock conductor, or to a conductor coupled directly to a signal external to the integrated circuit. In either embodiment, conductor 440 may be coupled directly to another conductor, or coupled through a buffer or other circuitry.

Figure 5:
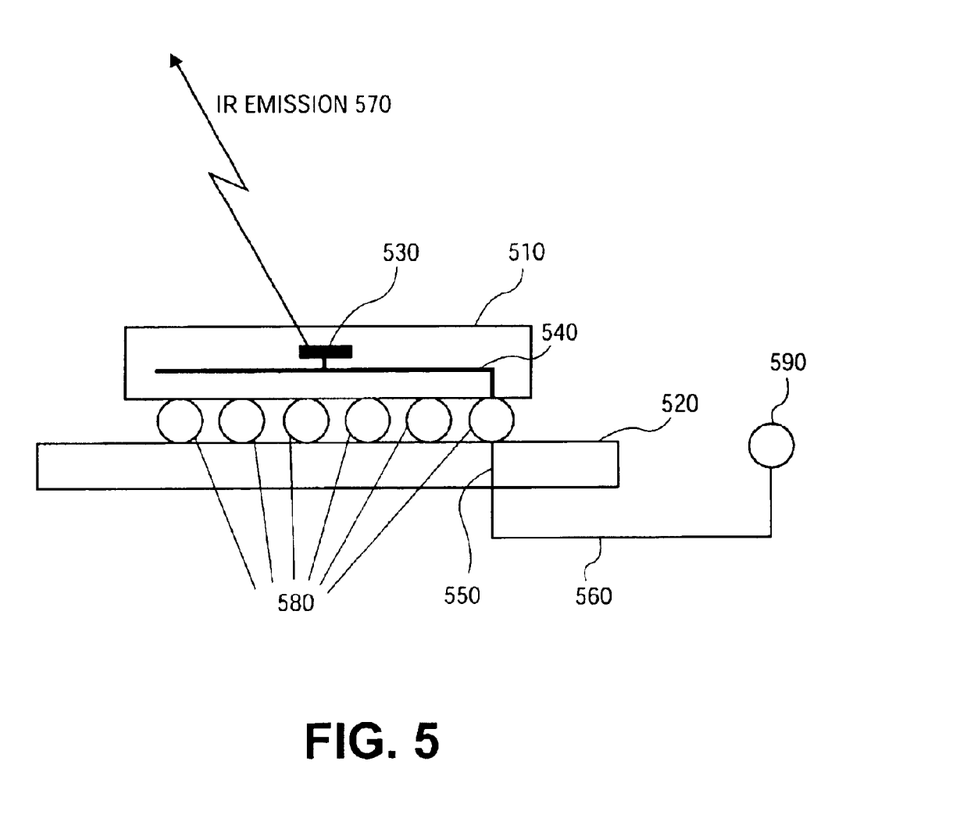
FIG. 5 illustrates an alternate embodiment of a beacon fiducial.

Turning to FIG. 5, use of a beacon fiducial is illustrated. Substrate 510 is a flip-chip or C4-mounted integrated circuit (C4 is an abbreviation for Controlled Collapse Chip Connection). At a variety of bond pads on substrate 510, solder balls 580 are connected to substrate 510. Connected to solder balls 580 is package 520. Conductor 550 connects a first solder ball 580 to lead 560, which in turn connects to signal generator 590. Signal generator 590 may be used to control the gate of a beacon fiducial, thus turning the fiducial on or off. Within substrate 510, conductor 540 couples the first solder ball 580 to beacon fiducial 530. When signal generator 590 causes the beacon fiducial to turn on, or conduct, IR emission 570 may be observed as infrared photons (or in alternate embodiments visible-wavelength photons) emanating from the beacon fiducial. It will be appreciated that photons with wavelengths other than those in the infrared spectrum may be observed under some circumstances, but the physics of silicon semiconductors makes infrared photons a good choice for attempted observation.

A beacon fiducial designed to be used in this manner may be designed to be much smaller than the prior art fiducials illustrated in FIG. 1. Experiments with one embodiment of a beacon fiducial as described have shown that a beacon fiducial formed with a minimum geometry transistor allows for finely tuned navigation to other features on the integrated circuit as predicted by layout diagrams corresponding to the manufacturing processes for the integrated circuit. In one instance, navigation within 0.1 $\mu$m of the actual location of other features on the die was demonstrated, based solely on navigating from the beacon fiducials. Moreover, such experiments indicate that the size of such a beacon fiducial may be further reduced as processes scale down. Also, it will be appreciated that varying the voltages applied to the beacon fiducial may vary the amount of energy emitted from the beacon fiducial, such that smaller fiducials may be used with sources of higher voltage.

This energy, emitted in the form of photons, is what may be detected for purposes of aligning equipment to the integrated circuit or correlating a layout diagram to the physical locations of features on the integrated circuit. The pattern of these emissions is such that the source of the emissions may be readily discerned by scanning a photon sensor over the surface (such as the backside surface of a semiconductor for example) and noting where the peak of the emitted photons occurs. The peak corresponds to the source of the emitted photons. Moreover, the intensity of the emitted photons may be adjusted as mentioned above by varying the voltages applied to the beacon fiducial. As a result, the size of the fiducial is not limited by the limits of optical resolution capabilities, but by the physics of the process involved in emitting the photons. Since the photon emission occurs at the atomic level, this limit tends to be significantly lower than the optical resolution limits, and the optical resolution limits do not apply to beacon fiducials since an optical system need not be used to locate beacon fiducials. Without the limitations imposed by the optical systems for navigating to the fiducials and other portions of the integrated circuit, navigation by sensing the emitted photons may result in reliable navigation within much less than 1–2 µms from the desired location on the integrated circuit.

Figure 6:
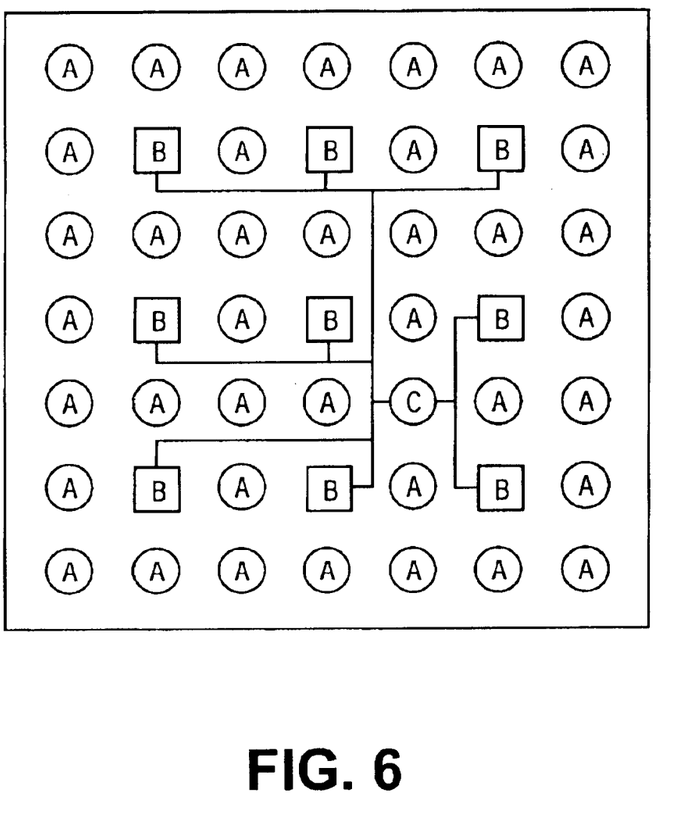
FIG. 6 illustrates a configuration of beacon fiducials and bond pads on an integrated circuit.

Turning to FIG. 6, one embodiment of an integrated circuit containing fiducials such as those described in relation to FIGS. 2 and 3 is illustrated. Bond pads A are spaced at regular intervals throughout the semiconductor substrate. Likewise, fiducials B are also spaced at regular intervals throughout the substrate. One bond pad, bond pad C, is electrically coupled to all of the fiducials B, such that infrared emissions from fiducials B may be caused by adjusting the voltage at bond pad C. It will be appreciated that FIG. 6 illustrates a block diagram, and that locations and connections therein are not scaled relative to each other. For instance, Bond pads A are typically square-shaped in conventional semiconductor technologies, but may be formed in any shape desired. Likewise, the relative sizes of Bond pads A and C and fiducials B are not illustrated, as fiducials B may be sized to be significantly smaller than Bond pads A and C. It will be appreciated that more fiducials B may be positioned on a substrate than the nine illustrated in FIG. 6, particularly since the fiducials B may be made small enough to fit between other circuitry embodied in an integrated circuit.

Figure 7:
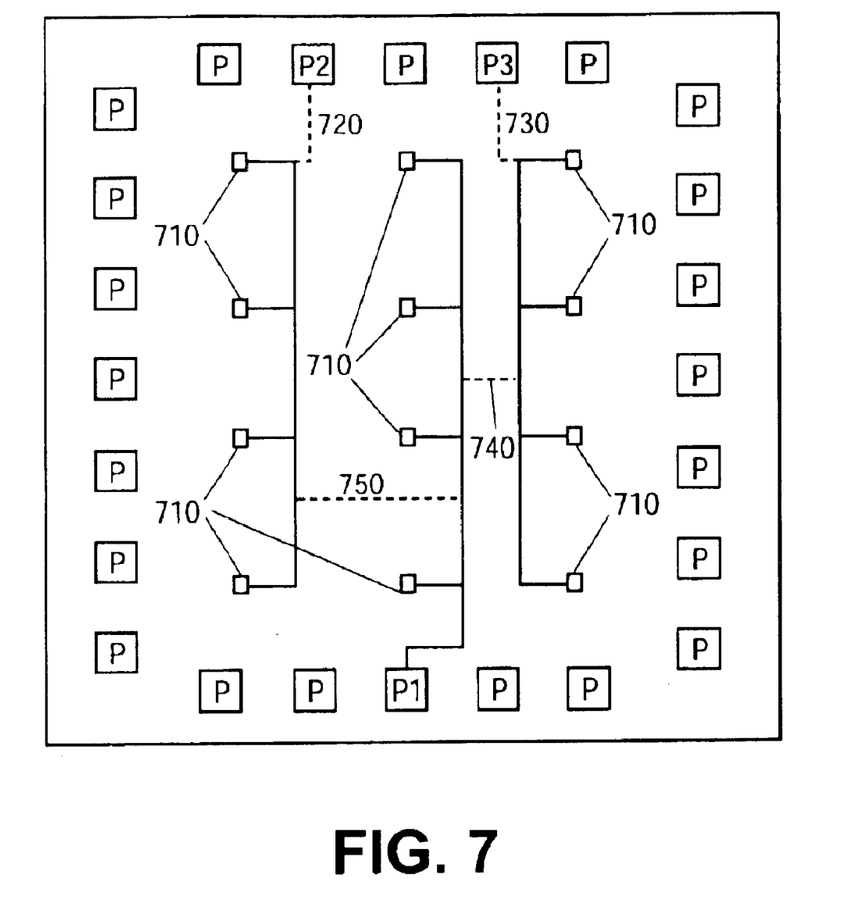
FIG. 7 illustrates an alternative configuration of beacon fiducials on an integrated circuit.

Alternatively, FIG. 7 illustrates another embodiment of an integrated circuit containing fiducials as described in relation to FIGS. 2 and 3. Bond Pads P are located on the perimeter of the integrated circuit. Fiducials 710 are distributed throughout the surface of the substrate in the integrated circuit. In one embodiment, a first set of four fiducials 710 are coupled together to bond pad P1, a second set of four fiducials 710 are coupled through conductor 720 to bond pad P2, and a third set of four fiducials 710 are coupled through conductor 730 to bond pad P3. Thus, some. indication of which fiducial is emitting photons (for example infrared photons) may be determined from analysis of which bond pad P is being set to a given voltage. In an alternative embodiment, the second set of fiducials is not coupled to bond pad P2 through conductor 720, but to the first set of fiducials through conductor 750. Likewise, the third set of fiducials is coupled to the first set of fiducials through conductor 740. Thus, all of the fiducials are coupled to common bond pad P1, and one bond pad may be used to produce infrared emission from all of the fiducials simultaneously. This bond pad may be dedicated for use only in conjunction with the fiducials, or may be used for other purposes when the circuit is in use, such as a power supply (Vcc) for example.

Figure 8:
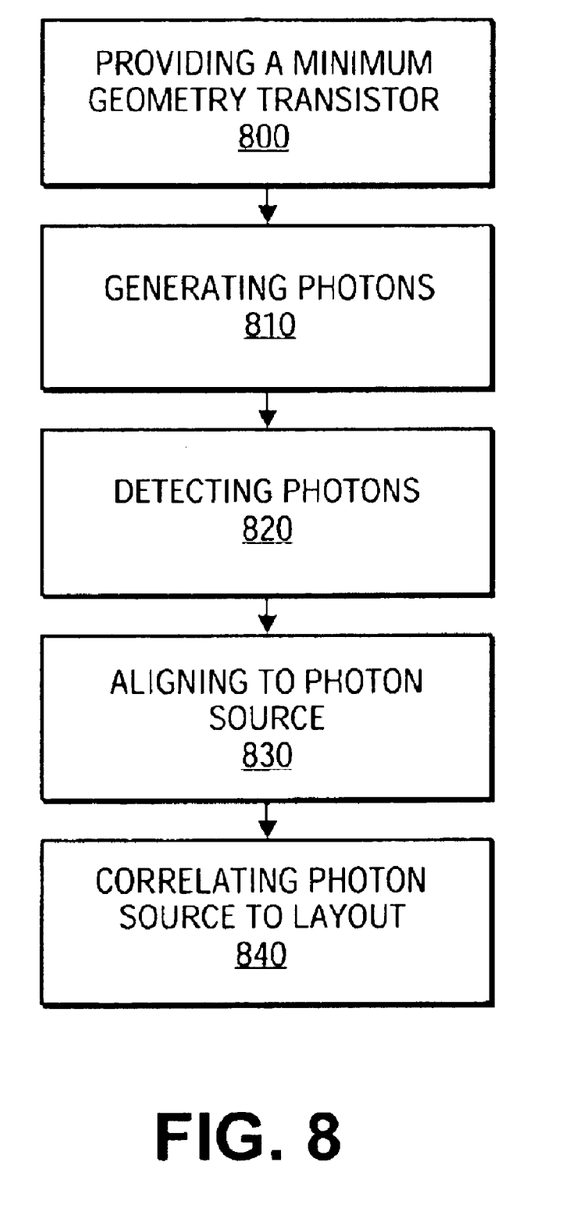
FIG. 8 provides a block diagram of a method of using a beacon fiducial.

Turning to FIG. 8, a flow diagram of one embodiment of a method of making and using the beacon fiducials described in relation to FIGS. 2 and 3 is illustrated. Initially, the beacon fiducial is created by providing a minimum geometry transistor with a control signal in block 810. Block 810 includes generating photons by adjusting the control signal. Block 820 includes detecting the generated photons (such as by a photon sensor) and determining their source(s) (such as by scanning a photon sensor across the backside of a semiconductor substrate for example), thus deriving a rough map of a portion of or of the entire substrate. Next, tools are aligned to the photon source or sources in block 830, such tools including a microscope or etching tool, for example. In block 840, the photon source(s) are correlated to a layout map of the integrated circuit. At this point, actual debugging of the integrated circuit or other profiling of the substrate. Note that the method may include thinning the substrate in which the transistor is Provided.

Figure 9:
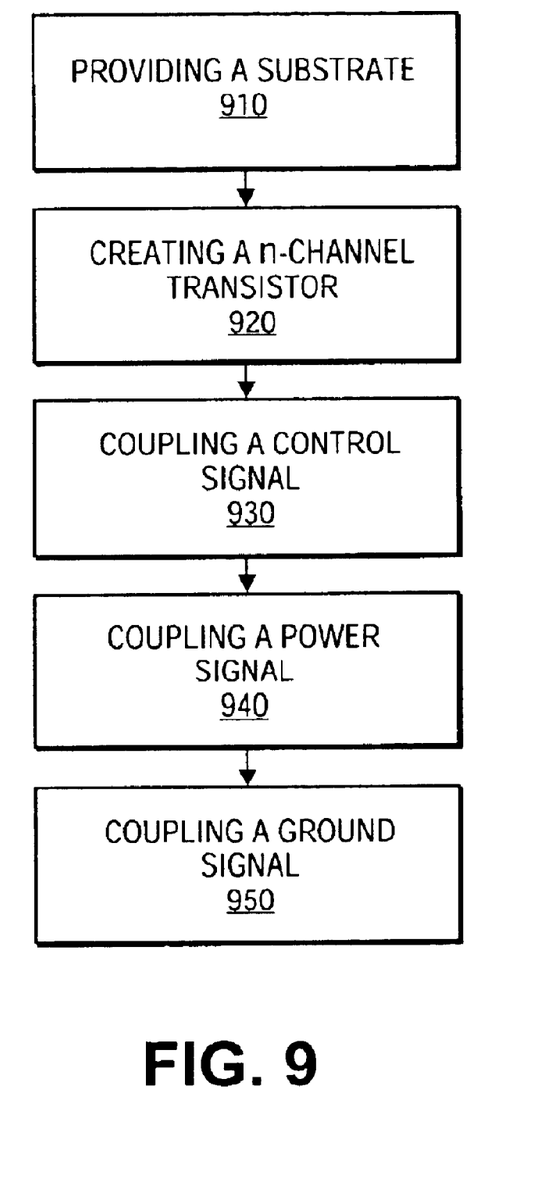
FIG. 9 provides a block diagram of a method of making a beacon fiducial.

Turning to FIG. 9, a flow diagram of how a fiducial may be made in one embodiment is provided. The method of making the fiducial may be described with reference also to FIG. 2. Initially, in block 910, a substrate such as the substrate 310 of FIG. 3 is provided. Following that, a n-channel transistor is created in block 920. Next, in block 930, a control signal is coupled to the transistor. Next, in block 940, a power signal is coupled to the transistor. Finally, in block 950, a ground signal is coupled to the transistor. It will be appreciated that the method may encompass more or less than exactly what is outlined here. For example, the method may also encompass coupling the signals to bond pads and bonding out the bond pads to wires in a package, thus allowing for access to the signals from outside a packaged integrated circuit.

In the foregoing detailed description, the method and apparatus of the present invention have been described with reference to specific exemplary embodiments thereof. It will, however, be evident that various modifications and changes may be made thereto without departing from the broader spirit and scope of the present invention. For example, the exemplary embodiments have been discussed with respect to a pn junction formed in silicon, but a similar junction formed in Gallium-Arsenide or other semiconducting materials may be used to form a fiducial in such a semiconductor within the spirit and scope of the present invention. Furthermore, it will be appreciated that while Vcc and Ground typically refer to a power signal or voltage and a zero or ground voltage respectively, they may also refer to a higher and lower voltage within a circuit respectively. The present specification and figures are accordingly to be regarded as illustrative rather than restrictive.

What is claimed is:

1. A method comprising:

thinning a substrate of an integrated circuit;

generating photons from a first beacon fiducial and a second beacon fiducial on the integrated circuit;

providing a first voltage to a first beacon fiducial on the integrated circuit to generate photons from the first beacon fiducial;

providing a second voltage to a second beacon fiducial on the integrated circuit to generate photons from the second beacon fiducial; and analyzing the first voltage and the second voltage to distinguish the source of photons detected from the first beacon fiducial and the second beacon fiducial.

2. The method of claim 1 further comprising:

locating the first beacon fiducial through analysis of the detection of the photons; and correlating a location of the first beacon fiducial on the integrated circuit to a layout map corresponding to the integrated circuit.

3. The method of claim 1, further comprising:

alternating a control signal of the first beacon fiducial between a state suitable for causing the first beacon fiducial to emit photons and a state suitable for causing the first beacon fiducial to not emit photons.

4. The method of claim 3 wherein:

the state suitable for causing the first beacon fiducial to emit photons is setting the control signal to a voltage near a power voltage and the state suitable for causing the first beacon fiducial to not emit photons is setting the control signal to a voltage near a ground voltage.

5. The method of claim 1 wherein:

the first beacon fiducial is electrically coupled to a circuit device of the integrated circuit.

6. The method of claim 5, wherein the first beacon fiducial is operatively decoupled from the circuit device.

7. The method of claim 1, wherein the photons are detected after the photons pass through a backside of the integrated circuit.

8. The method comprising:

thinning a substrate of an integrated circuit;

providing a voltage to a beacon fiducial on the integrated circuit to generate photons from the beacon fiducial;

varying the voltage to vary energy of the photons generated by the beacon fiducial; and detecting the photons generated from the beacon fiducial; and locating the beacon fiducial through analysis of the detection of the photons and the voltage provided to the beacon fiducial.

9. The method of claim 8, further comprising:

alternating a control signal of the beacon fiducial between a state suitable for causing the beacon fiducial to emit photons and a state suitable for causing the beacon fiducial to not emit photons.

10. The method of claim 9 wherein:

the state suitable for causing the beacon fiducial to emit photons is setting the control signal to a voltage near a power voltage and the state suitable for causing the beacon fiducial to not emit photons is setting the control signal to a voltage near a ground voltage.

11. The method of claim 8, further comprising:

locating the beacon fiducial through analysis of the detection of the photons; and correlating a location of the beacon fiducial on the integrated circuit to a layout map corresponding to the integrated circuit.

12. The method of claim 8, wherein the beacon fiducial is electrically coupled to a circuit device of the integrated circuit.

13. The method of claim 12, wherein the beacon fiducial is operatively decoupled from the circuit device.

14. The method of claim 8, wherein the photons are detected after the photons pass through a backside of the integrated circuit.

15. A method, comprising:

thinning a substrate of an integrated circuit;

adjusting a first voltage to a first bond pad on the integrated circuit, wherein the first bond pad is electrically coupled to each beacon fiducial of a first plurality of beacon fiducials on the integrated circuit to generate photons from the first plurality of beacon fiducials;

adjusting a second voltage to a second bond pad on the integrated circuit, wherein the second bond pad is electrically coupled to each beacon fiducial of a second plurality of beacon fiducials on the integrated circuit to generate photons from the second plurality of beacon fiducial;

detecting the photons generated from at least one of the first plurality of beacon fiducials and from at least one of the second plurality of beacon fiducials; and analyzing the first voltage at the first bond pad and the second voltage at the second bond pad to distinguish the source of photons from the first plurality of beacon fiducials and the second plurality of beacon fiducials.

16. The method of claim 15, comprising correlating a location of the at least one of the first plurality of beacon fiducials on the integrated circuit to a layout map corresponding to the integrated circuit.

17. The method of claim 15, further comprising correlating a location of the at least one of the second plurality of beacon fiducials on the integrated circuit to a layout map corresponding to the integrated circuit.

18. The method of claim 15, wherein the first bond pad is electrically coupled to a circuit device of the integrated circuit to electrically couple the first plurality of beacon fiducials to the circuit device.

19. The method of claim 18, wherein the first plurality of beacon fiducials are operatively decoupled from the circuit device.

20. The method of claim 15, wherein the photons are detected after the photons the integrated circuit.

* * * * *